RELIEF PRINTING PLATE

Filed Nov. 27, 1964

CLEMENS B. STARCK
FREDERICK J. JACOBY
INVENTORS
BY R. Frank Smith
Henry E. Byers
ATTORNEYS United States Patent Office 3,271,149
Patented Sept. 6, 1966

3,271,149
RELIEF PRINTING PLATE

Clemens B. Starck and Frederick J. Jacoby, Rochester, N.Y., assignors to Eastman Kodak Company, Rochester, N.Y., a corporation of New Jersey Filed Nov. 27, 1964, Ser. No. 414,291
25 Claims. (Cl. 96—35)

This invention concerns a relief printing plate, more particularly a relief printing plate obtained by deep etching a cellulose ester support by means of an integral resist image prepared by photographic means.

Photographic relief printing plates are well known since it has been relatively easy to obtain a photographic image in hardened colloid which could be obtained in a relief form by washing or removing the unhardened areas of the photographic emulsion.

To prepare conventional relief printing plates for direct or indirect printing having considerable relief, a photographic image has been formed on a metal surface after which the metal has been etched in the non-image areas. However, this method requires precautionary measures to reduce undercutting of the resist areas while the plates are being etched to sufficient depth in the non-image areas.

"Powdering" or "staging" techniques, e.g., involving application of dragons blood, and the use of emulsified solvents, are common with metal plates. In spite of these techniques, these metal plates often lack detail due to the undercutting or removal of the dot areas. Moreover, the process of preparing metal plates has been relatively expensive. Therefore, it has been desirable to make printing plates for direct printing having better detail and less cost than the conventional metal plates.

Attempts have been made in the past to prepare plasic relief printing plates by photographic means involving formation of a colloid resist image on a plastic layer, followed by solvent treatment of the unprotected areas useful in typographic or intaglio printing.

In the Baxter and Staehle application Serial No. 269,-345, filed April 1, 1963, incorporated herein by reference, a relief printing plate is described which achieves a high degree of success in providing a plastic relief printing plate by etching through a photographic image into the plastic support. A relief image is formed photographically in a light sensitive colloid, unexposed areas removed and a cellulose ester support attached with a solvent mixture in a cyclical process involving the steps of etching, removing the solvent, drying and re-etching until the plastic has been etched to a satisfactory depth.

The exposure of the light sensitive colloid is usually made either to a line image such as a typed image having high contrast, or to a halftone image. A typical image of this type would be a typewritten image on a white surface. To copy an image having gray areas, a screen is used and the exposure made to the screen. This results in an image comprised of small dots, the quantity of the dots being greater in the more dense areas than in the lighter or less dense areas. The degree of reproduction of a given relief printing plate controls the fineness of the dots which can be used. Accordingly, when halftone screens with very fine screen rulings were used, there has been experienced some difficulty in obtaining faithful reproduction. Successful operation in reproducing the smaller dots, such as the small dots in the highlight areas, depends on the supporting structure for the dots.

We have found that by changing the structure of the plastic support under the light sensitive colloid, that we can obtain better supporting structure for the dots and also improve the reproduction for line images.

One object of this invention is to provide an improved relief printing plate. A further object is to provide a printing plate capable of reproducing images exposed through extremely fine screen rulings. A still further object is to provide a plastic support having thereon coatings having a gradation of solubility which increases in the direction away from the light sensitive colloid to the metal support.

Other objects will appear from the following description of our invention.

In the Baxter and Staehle relief printing plate, a preferred embodiment comprises a metal base having thereon an adhesive layer bonding to the metal, a cellulose ester support. A light sensitive colloid layer is attached to the cellulose ester support by means of a thin subbing layer. The cellulose ester is preferably cellulose acetate butyrate but may be other cellulose esters such as cellulose acetate propionate, etc.

In our preferred embodiment, the light sensitive colloid, the subbing layer and the support are the same as those disclosed by Baxter and Staehle. However, the support material which is etched, has thereon at least one layer of less solubility than the support between the support and the subbing layer. For instance, in one embodiment, beginning with the layer directly under the subbing layer, there is a layer of clear cellulose acetate propionate having a solubility of about 7–11.5 g./liter in the etching solvent. Next is a layer of pigmented cellulose acetate propionate to give a white background. Under this is the cellulose acetate butyrate support having a solubility of about 14–18 g./liter. It will be appreciated that the use of two, three or more layers of increasing solubility depends upon the size of the dot structure being reproduced.

The plastic support may vary in thickness depending upon the ultimate use and may range from 8 mils to 40 mils, whereas, the various layers, identified herein as "support overlayers," which are coated over the plastic support, are relatively thin in proportion to the plastic support. These layers, as well as the support, may be of any plastic material subject to etching with volatile organic solvents, provided the solubility difference in the etching solvent is of the same degree of magnitude with respect to each of the other layers and the support. Preferably, the thickness of the overlayers on the support should be 0.10 to 0.25 mil for the first layer under the subbing layer and 0.20 to 0.35 mil for the second layer. If a third or more layers are desired, they may also be of a thickness of 0.20 to 0.35 mil. However, if only one overlayer is used, its thickness may be from 0.35 to 0.55 mil and its solubility about 7–11.5 g./liter in the etching solvent.

It will be appreciated that by plastic materials is meant organic polymeric materials such as, for example, cellulose esters, polyamides, polyesters, polyacrylics, polycarbonates, polyolefins, polymethanes, polyvinyls, condensation and addition polymers, etc. Of course, the plastic structure of the support and overlayers is preferably of similar plastics such as cellulose esters, etc., of differing solubilities, but in some instances, the overlayers and support may be of dissimilar plastics. For instance, a polyacrylic overlayer could be used over a cellulose ester, etc., provided satisfactory adhesion between the overlayers and support is obtained.

The pigments useful in pigmenting the layers are highly reflective materials of high refractive index such as titanium dioxide.

Over the film support is coated a thin subbing layer, overcoated with a light sensitive emulsion. The emulsion must be processed to a hardened resist image. If unhardened emulsions are used, the tanning agents may be incorporated in the emulsion or included in the processing solutions. If hardened emulsions are used, the resist image is formed by an etch bleach process.

In a typical embodiment of this invention, the use of a silver halide emulsion layer containing a substantially water-insoluble tanning developing agent is advantageous. Such an emulsion layer is coated over the top layer on the support, which contains no hardening agent for the emulsion and is adapted to give good adhesion to the emulsion by means of an extremely thin subbing layer such as, for example, a mixture of cellulose nitrate and gelatin.

The support may be laminated to a rigid or semirigid, humidity-stable base, such as a metal film or plate, so that dimensional change or distortion of the image during preparation and printing is minimized, although such an additional support may not be necessary for some purposes. The supports or layers thereon may be pigmented, for example, with titanium dioxide, etc. to provide a reflecting background for the image.

In our preferred embodiment a thin sheet of steel is used as the base. This steel is coated with an adhesive film, for example, about .002-inch of polyvinyl acetate. However, any suitable adhesive may be used and thickness of the adhesive is not critical provided it secures the film support to the base. A lacquer coating on the rigid support may be colored to provide an antihalation layer. In our preferred embodiment the antihalation feature is obtained from an orange-red lacquer which is coated on the steel.

The photosensitive material of our invention is processed to a relief printing plate capable of reproducing faithfully both line work and fine dot detail. For instance, the emulsion is exposed through a high contrast graphic arts type negative or to a screened photographic print. In the method of developing an unhardened emulsion with a silver halide tanning developer which hardens the image area, the non-image areas are removed by washing off the untanned gelatin. In the event a tanning developer containing emulsion is used, the emulsion is processed by imbibing an alkaline activator solution into the emulsion after which the non-image areas are washed away. The plate is then dried.

After photographic processing has been completed and a resist image in hardened gelatin has been formed, the exposed areas of the cellulose ester layer are subjected to repeated cycles of etching with semisolvent and removal of the semisolvent. The plate is attached to a convenient working surface and the semisolvent (etch solution comprising a mixture of a solvent and nonsolvent which swells and dissolves the ester support) is applied with a pile-covered fabric swab, using a vigorous, irregular pattern of rubbing. The rubbing action is continued for not more than 2 minutes and the dissolved material is rinsed away immediately using fresh semisolvent or nonsolvent, and the plate dried to remove residual solvent. The cycle is then repeated.

In this manner, in a sequence of up to 40 cycles, the cellulose ester support is etched to sufficient depth for relief printing. Each cycle comprises at least three steps: (1) application of semisolvent, (2) scrubbing to facilitate solution and removal of the exposed cellulose ester material and (3) removal of residual semisolvent or nonsolvent (drying).

The length of time the etching can be carried out during one stage without loss of detail is primarily a function of the fineness of detail in the image. In the case of typography and relatively coarse line work, or even large half-tone dots or tints, comparatively long stages may be employed so that depths of 0.002–0.003-inch in a 1-minute stage will result in no loss of detail. In the case of fine half-tones, however, the etching stage is preferably considerably shorter so that depth for a plate containing 5 percent highlights dots in a 133-line screen would be 0.001-inch or less per 20- to 30-second stage.

At the conclusion of each etching stage in the cycle, it is preferred that all surface solvent be squeegeed off and that the plate be dried with hot air and/or infrared radiation, then subsequently cooled to room temperature before the next etching stage.

The etching operation in our invention is extremely critical. One way in which the etching may be conveniently carried out is to attach the plate to the surface of a cylindrical etching drum. The etching solution is applied preferably by a sponge or pad rotating in an orbital manner. As the plate revolves around the drum, it is subjected to succeeding stages of processing.

At the next stage, the excess etching solvent is removed from the surface of the plate followed by the drying step. This operation is then repeated with the etching, squeegeeing and drying steps, until satisfactory depth of etch is obtained.

The humidity-resistant rigid or semirigid base used to minimize image distortion and prevent dimensional changes can advantageously be a metal sheet or plate, e.g., iron, steel, copper, zinc, magnesium, aluminum, or the like, or it can be a plastic material such as a melamine formaldehyde or phenol formaldehyde resin.

The subbing which holds the resist emulsion to the etchable cellulose ester layer performs a critical dual function in our invention. It must be of sufficient physical strength and hardness and sufficiently adherent to the adjacent surfaces to bond the cellulose ester layer firmly to the emulsion and to the resist image formed in the initial processing step, yet it must be readily etched through by the etching solvent in the "nonresist" areas.

A sub of gelatin-cellulose nitrate mixture within relatively narrow limits can be used. The subbing layer, which is much thinner than normally used in photographic applications, preferably contains between about 0.005 and 0.020 gram of solids per square foot, equivalent to 34 to 80 weight percent solids of gelatin and 66 to 20 weight percent solids of cellulose nitrate. The solvent used for applying the subbing layer should comprise a miscible mixture of solvents for both components, preferably a mixture of acetone, methanol and water.

A typical emulsion containing a tanning developing agent is described in column 3, lines 3 et seq., of U.S. Patent 2,596,756, issued May 13, 1952.

In the embodiment wherein the emulsions are substantially unhardened emulsions, they may contain up to 0.7 gram of dry formaldehyde per pound of dry freshly coated gelatin to reduce abrasion during handling, packaging and storage, or 0.1 ounce of the formaldehyde solution (40% formaldehyde solution diluted 1 to 3 with water) per pound of gelatin for a sample aged 3 to 6 months.

The etching solvents are preferably miscible mixtures of at least one solvent for the cellulose ester support and at least one nonsolvent. The solvents are chosen on the basis of their effect on the cellulose ester and their lack of attack on the gel resist image. Solvents may be, for example, isopropyl acetate, ethyl acetate, ethyl acetoacetate, 2-pentatone, acetone methylethyl ketone, glacial acetic acid, dichloromethane, "Cellosolve" (ethyleneglycol monomethylether), "Carbitol" (diethyleneglycol ethylether), etc. Nonsolvents may be, for example, methanol, propanol, isopropanol, butanol, diacetone alcohol, cyclohexane, xylene, toluene, Stoddard solvent, etc. A particularly useful etching mixture comprises dimethyl sulfoxide and isopropyl alcohol. Still another mixture may be ethyl lactate and lactic acid.

It will be appreciated that the ratio of solvent to nonsolvent will depend upon the particular compounds used and their effect on the cellulose ester. Useful ranges of 1:10 to 10:1 can be used.

In the attached diagram are shown diagrammatic representations of a typical printing plate prepared according to our invention.

FIG. 1 shows the plate prior to formation of the relief image comprising the emulsion layer 11 coated over a thin subbing layer 12 over a layer of clear cellulose acetate propionate 13 over a layer of pigmented cellulose acetate propionate 14 over an extra thick cellulose acetate butyrate layer 15. This cellulose ester layer is adhered by means of an adhesive layer 16 to a rigid or semirigid base 17.

Figure 1:
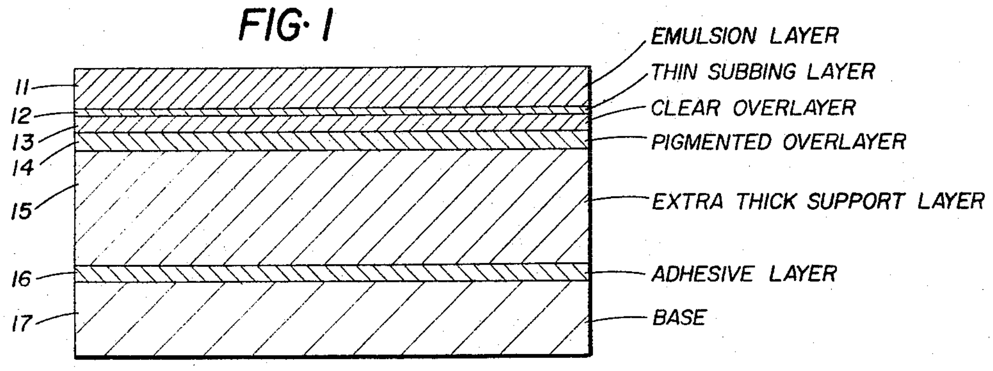
Figure 2:
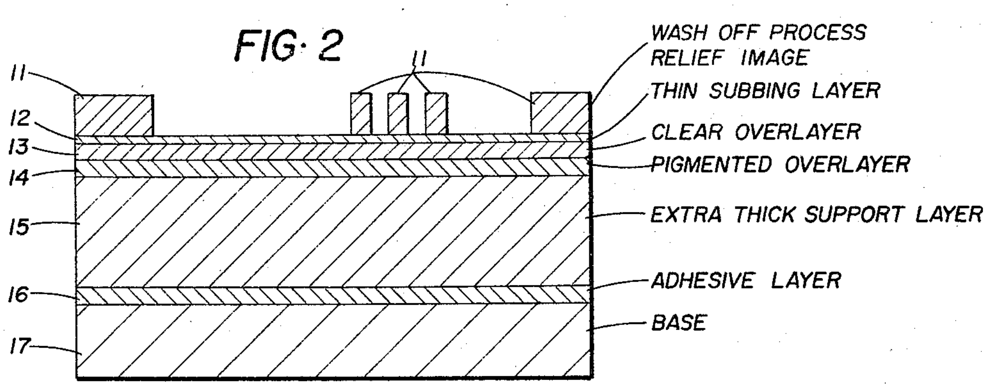
FIG. 2 shows the same printing plate material as illustrated in FIG. 1 after processing the exposed silver halide emulsion with a tanning developing agent and washing off the untanned areas of the emulsion layer.
Figure 3:
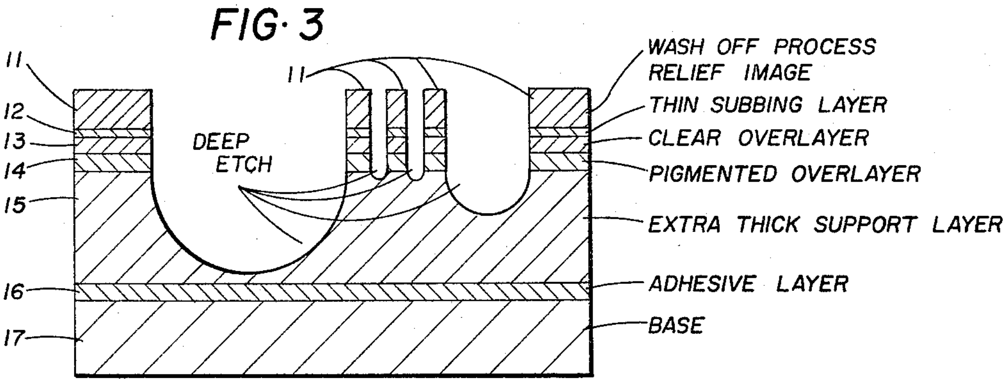
FIG. 3 shows the same printing plate as described in FIG. 2 after the etching step, ready for use on the printing press.

The following examples are intended to illustrate our invention but not to limit it in any way.

*Example 1*

An emulsion of the type described in Example 1 of U.S. 2,596,756, issued May 13, 1952, containing an incorporated tanning developing agent was coated onto the uppermost of the support overlayers coated on a sheet of 8¼ mil thick, clear, cellulose acetate butyrate. A very thin subbing layer was coated on the overlayer to afford adhesion for the emulsion. The sub was coated from a solution containing 25 percent cellulose nitrate and 75 percent gelatin at 0.012 gram per square foot using an acetone methanol water solvent. The back side of the acetate butyrate carried a cellulose nitrate sub. A sheet of 0.010-inch steel plate having a polyvinyl acetate resin (Elvacet-Du Pont 60–05) coated from methanol about 0.005-inch thick was then laminated to the film product. To effect the lamination, a sheet of 8-inch x 10-inch film product was passed between heated rollers about 250° F. in contact with a slightly smaller piece of steel. This operation was carried out under a red safelight Series 1A. The element as prepared above was used in the following way to prepare a relief printing plate.

The standard test object contained 20 areas including areas exposed through line screens including 120, 133, 150, 200 and 300 lines. Objects containing gradations in density were included so that a test of half-tone reproduction could be made. The test negative was used in close contact with the emulsion an exposure of 15 seconds was made at 2 feet from a 100-watt lamp.

The exposed plate was transferred to an alkaline activator bath comprising 10 percent aqueous solution of sodium carbonate. After 1 minute, it was placed in a 5 percent acetic acid stop bath for 15 seconds to halt development. A warm water spray at 100° F. was used to remove the unhardened areas.

The plate was then dried in a drying cabinet for 10 minutes. The dried plate was attached firmly to a flat surface and the etching process was begun. A nylon velvet plush swab about 8 x 10 inches was used with the following solvent: one part by volume of isopropyl acetate, two parts isobutyl acetate and one part isopropyl alcohol. A random pattern scrubbing action was used with moderate pressure. After about 30 seconds, a liberal amount of alcohol was applied to the surface to neutralize the solvent action and to aid in the removal of the etched-out material which was effected with a rubber squeegee blade. The plate was then transferred to a drying cabinet at 150° F. for at least 5 minutes to remove substantially all of the solvent. The depth of the etching at the end of the first bite was only little more than 0.0005-inch.

A second treatment of solvent and swabbing action was given following the procedure used previously. The cycles of etching, neutralizing and drying were continued for 8 times to produce a printing plate and the broad non-printing areas were etched to 0.0005-inch.

The 20 areas of the standard test object are arranged in order of progressive failure. If there is dot loss in any area, plates are evaluated as follows:

| | |
|---|---|
| Few dots lost | Very good. |
| Less than half dots lost | Good. |
| More than half dots lost | Fair. |
| Almost all dots lost | Poor. |
| All dots lost | Very poor. |

The overlayers identified below were coated with the first overlayer mentioned nearest the support layer with the second overlayer coated over the first mentioned.

| Examples | Overcoats | Highlight Half-Tone Dot Retention |
|---|---|---|
| 1 | CAB [1] pigmented | Very poor. |
| 2 | CAP [2] pigmented + CAP clear | Good. |
| 3 | CAB pigmented | Poor. |
| 4 | CAP pigmented + CAP clear | Good to very good. |
| 5 | CAP pigmented single layers | Good. |
| 6 | Two CAP pigmented | Very good. |
| 7 | CAB pigmented | Very poor. |
| 8 | CAP pigmented + CAP clear | Good to very good. |
| 9 | Single CAP pigmented | Fair to good. |
| 10 | CAP pigmented + CAP clear | Good to very good. |
| 11 | Two CAP pigmented | Good. |
| 12 | Single CAP pigmented | Good. |
| 13 | Thin CAP pigmented + CAP clear | Good. |
| 14 | Thin CAP pigmented | Good. |
| 15 | CAP pigmented + CAP clear | Very good. |
| 16 | Single CAP pigmented | Fair. |

[1] CAB—cellulose acetate butyrate.
[2] CAP—cellulose acetate propionate.

The thin coatings were about 0.20–0.25 mil thick whereas the other first overlayers were about 0.30–0.35 mil. The second overlayers were about 0.25–0.35 mil thick.

Both the pigmented and clear overlayers consist of 0.7 to 2% by weight of cellulose acetate butyrate or cellulose acetate propionate in a mixture of acetone and methyl alcohol.

The pigmented overlayer contains from 2 to 4 percent of the weight of the mixture described above of a pigment with a high refractive index which reflects most of the light incident on the particles. Such pigments include titanium dioxide, barium sulfate and calcium sulfate, but titanium dioxide is the preferred pigment.

The invention has been described in detail with particular reference to preferred embodiments thereof, but it will be understood that variations and modifications can be effected within the spirit and scope of the invention as described hereinabove and as defined in the appended claims.

We claim:

1. A photosensitive element for preparing plastic relief printing plates by etching the plastic imagewise with a semisolvent for the plastic, comprising an organic plastic support having a thickness of about 8 to 40 mils, having thereon at least one thin organic plastic overlayer of less solubility in the semisolvent than the support, having thereon a gelatino silver halide, light sensitive emulsion strongly adhered to the overlayer by means of a thin subbing layer no thicker than that having a coverage of about 0.020 g./sq. ft. and capable of being etched imagewise by a semisolvent for the plastic.

2. A photosensitive element for preparing plastic relief printing plates by etching the plastic imagewise with a semisolvent for the plastic, comprising an organic plastic support having a thickness of about 8 to 40 mils and a solubility of about 14–18 g./liter in the semisolvent, having thereon at least one thin organic plastic overlayer having a solubility of about 7–11.5 g./liter, having thereon a gelatino silver halide, light sensitive emulsion strongly adhered to the overlayer by means of a thin subbing layer no thicker than that having a coverage of about 0.020 g./sq. ft. and capable of being etched imagewise by the semisolvent for the support.

3. A photosensitive element for preparing relief printing plates by etching the support imagewise with a semisolvent for the support, comprising a cellulose ester support having a thickness of about 8 to 40 mils, having thereon at least one thin organic plastic overlayer having less solubility in the semisolvent than the cellulose ester and having thereon a gelatino silver halide, light sensitive emulsion strongly adhered to the overlayer by means of a thin subbing layer no thicker than that having a coverage of about 0.020 g./sq. ft. and capable of being etched imagewise by a semisolvent for the cellulose ester.

4. A photosensitive element for preparing plastic relief printing plates by etching the plastic imagewise with a semisolvent for the plastic, comprising a cellulose ester support having a thickness of about 8 to 40 mils, having thereon at least one thin cellulose ester overlayer of less solubility in the semisolvent than the support, having thereon a gelatino silver halide, light sensitive emulsion strongly adhered to the overlayer by means of a thin subbing layer no thicker than that having a coverage of about 0.020 g./sq. ft. and capable of being etched imagewise by a semisolvent for the plastic.

5. A photosensitive element for preparing plastic relief printing plates by etching the plastic imagewise with a semisolvent for the plastic, comprising a cellulose acetate butyrate support having a thickness of about 8 to 40 mils and a solubility of about 14–18 g./liter in the semisolvent, having thereon at least one thin cellulose acetate propionate overlayer having a solubility of about 7–11.5 g./liter, having thereon a gelatino silver halide, light sensitive emulsion strongly adhered to the overlayer by means of a thin subbing layer no thicker than that having a coverage of about 0.020 g./sq. ft. and capable of being etched imagewise by the semisolvent for the support.

6. A photosensitive element for preparing plastic relief printing plates by etching the plastic imagewise with a semisolvent for the plastic, comprising an organic plastic support having a thickness of about 8 to 40 mils, having thereon an organic plastic overlayer of less solubility in the semisolvent than the support, having a thickness of about 0.35–0.55 mil, having thereon a gelatino silver halide, light sensitive emulsion strongly adhered to the overlayer by means of a thin subbing layer no thicker than that having a coverage of about 0.020 g./sq. ft. and capable of being etched imagewise by a semisolvent for the plastic.

7. A photosensitive element for preparing plastic relief printing plates by etching the plastic imagewise with a semisolvent for the plastic, comprising an organic plastic support having a thickness of about 8 to 40 mils and a solubility of about 14–18 g./liter in the semisolvent, having thereon an organic plastic overlayer having a thickness of about 0.35–0.55 mil, having a solubility of about 7–11.5 g./liter, having thereon a gelatino silver halide, light sensitive emulsion strongly adhered to the overlayer by means of a thin subbing layer no thicker than that having a coverage of about 0.020 g./sq. ft. and capable of being etched imagewise by the semisolvent for the support.

8. A photosensitive element for preparing relief printing plates by etching the support imagewise with a semisolvent for the support, comprising a cellulose ester support having a thickness of about 8 to 40 mils, having thereon an organic plastic overlayer having a thickness of about 0.35–0.55 mil, having less solubility in the semisolvent than the cellulose ester and having thereon a gelatino silver halide, light sensitive emulsion strongly adhered to the overlayer by means of a thin subbing layer no thicker than that having a coverage of about 0.020 g./sq. ft. and capable of being etched imagewise by a semisolvent for the cellulose ester.

9. A photosensitive element for preparing plastic relief printing plates by etching the plastic imagewise with a semisolvent for the plastic, comprising a cellulose ester support having a thickness of about 8 to 40 mils, having thereon a cellulose ester overlayer of less solubility in the semisolvent than the support, having a thickness of about 0.35–0.55 mil, having thereon a gelatino silver halide, light sensitive emulsion strongly adhered to the overlayer by means of a thin subbing layer no thicker than that having a coverage of about 0.020 g./sq. ft. and capable of being etched imagewise by a semisolvent for the plastic.

10. A photosensitive element for preparing plastic relief printing plates by etching the plastic imagewise with a semisolvent for the plastic, comprising a cellulose acetate butyrate support having a thickness of about 8 to 40 mils and a solubility of about 14–18 g./liter in the semisolvent, having thereon a cellulose acetate propionate overlayer having a solubility of about 7–11.5 g./liter, having a thickness of about 0.35–0.55 mil, having thereon a gelatino silver halide, light sensitive emulsion strongly adhered to the overlayer by means of a thin subbing layer no thicker than that having a coverage of about 0.020 g./sq. ft. and capable of being etched imagewise by the semisolvent for the support.

11. A photosensitive element for preparing plastic relief printing plates by etching the plastic imagewise with a semisolvent for the plastic, comprising an organic plastic support having a thickness of about 8 to 40 mils, having thereon two organic plastic overlayers of less solubility in the semisolvent than the support, the first overlayer nearest the support having a thickness of about 0.20–0.35 mil, the second overlayer having a thickness of about 0.10–0.25 mil, having on the second overlayer a gelatino silver halide, light sensitive emulsion strongly adhered to the second overlayer by means of a thin subbing layer no thicker than that having a coverage of about 0.020 g./sq. ft. and capable of being etched imagewise by a semisolvent for the plastic.

12. A photosensitive element for preparing plastic relief printing plates by etching the plastic imagewise with a semisolvent for the plastic, comprising an organic plastic support having a thickness of about 8 to 40 mils and a solubility of about 14–18 g./liter in the semisolvent, having thereon two organic plastic overlayers having a solubility of about 7–11.5 g./liter, the first overlayer nearest the support having a thickness of about 0.20–0.35 mil, the second overlayer having a thickness of about 0.10–0.25 mil, having on the second overlayer a gelatino silver halide, light sensitive emulsion strongly adhered to the second overlayer by means of a thin subbing layer no thicker than that having a coverage of about 0.020 g./sq. ft. and capable of being etched imagewise by the semisolvent for the support.

13. A photosensitive element for preparing relief printing plates by etching the support imagewise with a semisolvent for the support, comprising a cellulose ester support having a thickness of about 8 to 40 mils, having thereon two organic plastic overlayers having less solubility in the semisolvent than the cellulose ester, the first overlayer nearest the support having a thickness of about 0.20–0.35 mil, the second overlayer having a thickness of about 0.10–0.25 mil and having on the second overlayer a gelatino silver halide, light sensitive emulsion strongly adhered to the second overlayer by means of a thin subbing layer no thicker than that having a coverage of about 0.020 g./sq. ft. and capable of being etched imagewise by a semisolvent for the cellulose ester.

14. A photosensitive element for preparing plastic relief printing plates by etching the plastic imagewise with a semisolvent for the plastic, comprising a cellulose ester support having a thickness of about 8 to 40 mils, having thereon two cellulose ester overlayers of less solubility in the semisolvent than the support, the first overlayer nearest the support having a thickness of about 0.20–0.35 mil, the second overlayer having a thickness of about 0.10–0.25 mil, having on the second overlayer a gelatino silver halide, light sensitive emulsion strongly adhered to the second overlayer by means of a thin subbing layer no thicker than that having a coverage of about 0.020 g./sq. ft. and capable of being etched imagewise by a semisolvent for the plastic.

15. A photosensitive element for preparing plastic relief printing plates by etching the plastic imagewise with a semisolvent for the plastic, comprising a cellulose acetate butyrate support having a thickness of about 8 to 40 mils and a solubility of about 14–18 g./liter in the semisolvent, having thereon two cellulose acetate propionate overlayers having a solubility of about 7–11.5 g./liter, the first overlayer nearest the support having a thickness of about 0.20–0.35 mil, the second overlayer having a thickness of about 0.10–0.25 mil, having on the second overlayer a gelatino silver halide, light sensitive emulsion strongly adhered to the second overlayer by means of a thin subbing layer no thicker than that having a coverage of about 0.020 g./sq. ft. and capable of being etched imagewise by the semisolvent for the support.

16. A photosensitive element for preparing plastic relief printing plates by etching the plastic imagewise with a semisolvent for the plastic, comprising an organic plastic support having a thickness of about 8 to 40 mils, laminated to a dimensionally stable base having thereon at least one organic plastic overlayer of less solubility in the semisolvent than the support, having thereon a gelatino silver halide, light sensitive emulsion strongly adhered to the overlayer by means of a thin subbing layer no thicker than that having a coverage of about 0.020 g./sq. ft. and capable of being etched imagewise by a semisolvent for the plastic.

17. A photosensitive element for preparing plastic relief printing plates by etching the plastic imagewise with a semisolvent for the plastic, comprising an organic plastic support having a thickness of about 8 to 40 mils and a solubility of about 14–18 g./liter in the semisolvent, laminated to a dimensionally stable base having thereon at least one thin organic plastic overlayer having a solubility of about 7–11.5 g./liter, having thereon a gelatino silver halide, light sensitive emulsion strongly adhered to the overlayer by means of a thin subbing layer no thicker than that having a coverage of about 0.020 g./sq. ft. and capable of being etched imagewise by the semisolvent for the support.

18. A photosensitive element for preparing relief printing plates by etching the support imagewise with a semisolvent for the support, comprising a cellulose ester support having a thickness of about 8 to 40 mils, laminated to a dimensionally stable base having thereon at least one thin organic plastic overlayer having less solubility in the semisolvent than the cellulose ester and having thereon a gelatino silver halide, light sensitive emulsion strongly adhered to the over-layer by means of a thin subbing layer no thicker than that having a coverage of about 0.020 g./sq. ft. and capable of being etched imagewise by a semisolvent for the cellulose ester.

19. A photosensitive element for preparing plastic relief printing plates by etching the plastic imagewise with a semisolvent for the plastic, comprising a cellulose ester support having a thickness of about 8 to 40 mils, laminated to a dimensionally stable base having thereon at least one thin cellulose ester overlayer of less solubility in the semisolvent than the support, having thereon a gelatino silver halide, light sensitive emulsion strongly adhered to the overlayer by means of a thin subbing layer no thicker than that having a coverage of about 0.020 g./sq. ft. and capable of being etched imagewise by a semisolvent for the plastic.

20. A photosensitive element for preparing plastic relief printing plates by etching the plastic imagewise with a semisolvent for the plastic, comprising a cellulose acetate butyrate support having a thickness of about 8 to 40 mils and a solubility of about 14–18 g./liter in the semisolvent, laminated to a dimensionally stable base having thereon at least one thin cellulose acetate propionate overlayer having a solubility of about 7–11.5 g./liter, having thereon a gelatino silver halide, light sensitive emulsion strongly adhered to the overlayer by means of a thin subbing layer no thicker than that having a coverage of about 0.020 g./sq. ft. and capable of being etched imagewise by the seimsolvent for the support.

21. A photosensitive element for preparing plastic relief printing plates by etching the plastic imagewise with a semisolvent for the plastic, comprising an organic plastic support having a thickness of about 8 to 40 mils, having thereon two organic plastic overlayers of less solubility in the semisolvent than the support, the first overlayer nearest the support being pigmented and having a thickness of about 0.20–0.35 mil, the second overlayer having a thickness of about 0.10–0.25 mil, having on the second overlayer a gelatino silver halide, light sensitive emulsion strongly adhered to the second overlayer by means of a thin subbing layer no thicker than that having a coverage of about 0.020 g./sq. ft. and capable of being etched imagewise by a semisolvent for the plastic.

22. A relief printing plate having an image thereon comprising an organic plastic support having a thickness of about 8–40 mils in the image areas, laminated to a base, capable of being readily etched imagewise by a semisolvent for the plastic, having thereon at least one thin organic plastic overlayer of less solubility in the semisolvent than the support and having a gelatino-silver image layer adhered to the image areas of the uppermost overlayer by means of a thin subbing layer no thicker than that having a coverage of about 0.020 g./sq. ft. and capable of being readily etched imagewise by a semisolvent for the organic plastic, said plate having the organic plastic etched to a depth of at least 0.005 inch in the deepest of the non-image areas of the organic plastic support by repeated cycles of (1) etching with a semisolvent for the organic plastic, (2) removing the semisolvent and (3) drying to form a relief image with line or dot areas substantially free from undercutting.

23. A relief printing plate having an image thereon comprising a cellulose ester support laminated to a base, having a thickness of about 8–40 mils in the image areas, capable of being readily etched imagewise by a semisolvent for the cellulose ester, having thereon at least one thin cellulose ester overlayer of less solubility in the semisolvent than the support and having a gelatino-silver image layer adhered to the image area of the uppermost overlayer by means of a thin subbing layer no thicker than that having a coverage of about 0.020 g./sq. ft. and capable of being readily etched imagewise by a semisolvent for the cellulose ester, said plate having the cellulose ester etched to a depth of at least 0.005 inch in the deepest of the non-image areas of the cellulose ester support by repeated cycles of (1) etching with a semisolvent for the cellulose ester, (2) removing the semisolvent and (3) drying to form a relief image with line or dot areas substantially free from undercutting.

24. A relief printing plate having an image thereon comprising a cellulose ester support having a thickness of about 8–40 mils in the image areas, laminated to a base, capable of being readily etched imagewise by a semisolvent for the cellulose ester, and having a solubility of about 14–18 g./liter in the semisolvent, having thereon at least one thin cellulose ester overlayer having a solubility of about 7–11.5 g./liter, having a gelatino-silver image layer adhered to the uppermost overlayer by means of a thin subbing layer no thicker than that having a coverage of 0.020 g./sq. ft. and capable of being readily etched imagewise by a semisolvent for the cellulose ester, said plate having the cellulose ester etched to a depth of at least 0.005 inch in the deepest of the non-image areas of the cellulose ester support by repeated cycles of (1) etching with a semisolvent for the cellulose ester, (2) removing the semisolvent and (3) drying to form a relief image with line or dot areas substantially free from undercutting.

25. A relief printing plate having an image thereon comprising a cellulose acetate butyrate support having a thickness of about 8–40 mils in the image areas, laminated to a base, capable of being readily etched imagewise by a semisolvent for the cellulose acetate butyrate, and a solubility of about 14–18 g./liter in the semisolvent, having thereon at least one thin cellulose acetate propionate overlayer having a solubility of about 7–11.5 g./liter and having a gelatino-silver image layer adhered to the image area of the uppermost layer by means of a thin subbing layer no thicker than that having a coverage of about 0.020 g./sq. ft. and capable of being readily etched imagewise by a semisolvent for the cellulose acetate butyrate, said plate having the cellulose acetate butyrate etched to a depth of at least 0.005 inch in the deepest of the non-image areas of the cellulose acetate butyrate support by repeated cycles of (1) etching with a semisolvent for the butyrate, (2) removing the semisolvent and (3) drying to form a relief image with line or dot areas substantially free from undercutting.

References Cited by the Examiner

UNITED STATES PATENTS

| | | | |
|---|---|---|---|
| 2,083,640 | 6/1937 | Couch et al. | 96—83 |
| 2,257,143 | 9/1941 | Wood | 96—36 |
| 3,036,916 | 5/1962 | Notley | 96—35 X |
| 3,043,695 | 7/1962 | Alles | 96—35 X |
| 3,060,027 | 10/1962 | Freundorfer et al. | 96—35 |
| 3,169,066 | 2/1965 | Hoerner | 96—35 |

NORMAN G. TORCHIN, *Primary Examiner.*

ALEXANDER D. RICCI, *Examiner.*

C. L. BOWERS, *Assistant Examiner.*